United States Patent
Plojhar et al.

(10) Patent No.: US 10,236,771 B1
(45) Date of Patent: Mar. 19, 2019

(54) METHODS AND SYSTEMS OF DETECTING FAILURE MODES OF DC TO DC POWER CONVERTERS

(71) Applicant: SEMICONDUCTOR COMPONENTS INDUSTRIES, LLC, Phoenix, AZ (US)

(72) Inventors: Jan Plojhar, Mokra Horalov (CZ); Pavel Horsky, Brno (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/955,899

(22) Filed: Apr. 18, 2018

Related U.S. Application Data (60) Provisional application No. 62/608,434, filed on Dec. 20, 2017.

(51) Int. Cl.
*H02M 3/137* (2006.01)
*H03M 1/10* (2006.01)
*H02M 1/08* (2006.01)
*H05B 33/08* (2006.01)
*H02M 1/00* (2006.01)

(52) U.S. Cl.
CPC ............ *H02M 3/137* (2013.01); *H02M 1/08* (2013.01); *H03M 1/1076* (2013.01); *H05B 33/0887* (2013.01); *H02M 2001/0009* (2013.01); *H02M 2001/0025* (2013.01)

(58) Field of Classification Search
CPC ............ H05B 33/0815; H05B 33/0821; H05B 33/0887; H05B 37/02; H02M 1/08; H02M 1/44; H02M 3/156; H02M 2001/009; H02M 2001/0025; Y02B 20/48
See application file for complete search history.

(56) References Cited

U.S. PATENT DOCUMENTS

| | | | | |
|---|---|---|---|---|
| 9,006,977 B2 * | 4/2015 | Gunda | ............... | H05B 33/0893 |
| | | | | 315/119 |
| 9,113,528 B2 * | 8/2015 | Bora | .................. | H05B 33/0863 |
| 9,204,512 B2 * | 12/2015 | Boezen | ............. | H05B 33/0848 |
| 9,295,144 B2 * | 3/2016 | Bora | .................. | H05B 33/0863 |
| 9,538,601 B1 * | 1/2017 | Mangtani | ........... | H05B 33/0854 |
| 9,887,614 B1 | 2/2018 | Horsky et al. | | |

* cited by examiner

*Primary Examiner* — Haissa Philogene
(74) *Attorney, Agent, or Firm* — Mark E. Scott; Dickinson Wright PLLC (57) ABSTRACT

Detecting failure modes of DC to DC power converters. In a system comprising a lighting microcontroller communicatively coupled to a direct current (DC) to DC power converter coupled to light-emitting diodes (LEDs) by way of an inductor, an example method may include: commanding, by the lighting microcontroller, the power converter to control an average current provided to the LEDs; reading, by the lighting microcontroller, values from the power converter; and detecting, by the lighting controller, one or more failure modes of the power converter based on the values.

20 Claims, 7 Drawing Sheets

METHODS AND SYSTEMS OF DETECTING FAILURE MODES OF DC TO DC POWER CONVERTERS

CROSS-REFERENCE TO RELATED APPLICATIONS

This application claims the benefit of U.S. Provisional Application Ser. No. 62/608,434 filed Dec. 20, 2017 titled "LED Driver Buck DCDC Convertor Diagnostic." The provisional application is incorporated by reference herein as if reproduced in full below.

BACKGROUND

Light-emitting diodes (LEDs) are increasing in popularity for lighting systems for a variety of reasons. The reasons for increased popularity may include greater light produced per unit of power supplied to the LED (compared, for example, to incandescent bulbs), and controllability of the LEDs. The popularity increase of LEDs is also true for the automotive industry. In some industries, including the automotive industry, various functional safety standards (e.g., ISO 26262) dictate that driver circuits for LEDs be able to detect and handle fault conditions. For example, in the case of headlights for an automobile, the functional safety systems need to be able to detect not only failures resulting in too little light being produced (e.g., dangerous for the driver) but also failures resulting in too much light being produced (e.g., dangerous for oncoming drivers).

BRIEF DESCRIPTION OF THE DRAWINGS

For a detailed description of example embodiments, reference will now be made to the accompanying drawings in which.

DEFINITIONS

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

The terms "input" and "output" when used as nouns refer to connections (e.g., electrical, software), and shall not be read as verbs requiring action. For example, a timer circuit on a substrate may define a clock output. The example timer circuit may create or drive a clock signal on the clock output. In systems implemented directly in hardware (e.g., on a semiconductor substrate), these "inputs" and "outputs" define electrical connections. In systems implemented in software, these "inputs" and "outputs" define parameters read by or written by, respectively, the instructions implementing the function.

"Lead" when used as a noun refers to a connection (e.g., electrical, software), and shall not be read as a verb requiring action. For example, a single pole, single throw switch defines a first lead and a second lead. As another example, a double pole, double throw switch defines four leads.

"Controller" shall mean individual circuit components on a substrate, an application specific integrated circuit (ASIC) constructed on a substrate, a microcontroller constructed on a substrate (with controlling software stored on or off the substrate), or combinations thereof configured to read signals and take control actions responsive to such signals.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various embodiments are directed to methods and systems of detecting failure modes of direct current (DC) to DC power converters. More particularly, example embodiments are directed to systems including a lighting microcontroller communicatively coupled to a buck-type DC to DC power converter executing average current control, with the power converter driving one or more LEDs by way of an inductor. The lighting microcontroller, and in some cases the power converter, are designed and constructed to detect one or more failure modes of the power converter and related circuitry. For example, the system may detect failure modes such as: failure of one or more timers within the power converter; failure of a control switch or groups of switches implemented as swap blocks within the power converter; failures related to a sense transistor associated with a main switching transistor within the power converter; failure of the main transistor within the power converter; failure of one or more digital-to-analog (D/A) converters implemented with the power converter; and an unexpected change of inductance of the inductor. The specification first turns to a high level description of an example system.

Figure 1:
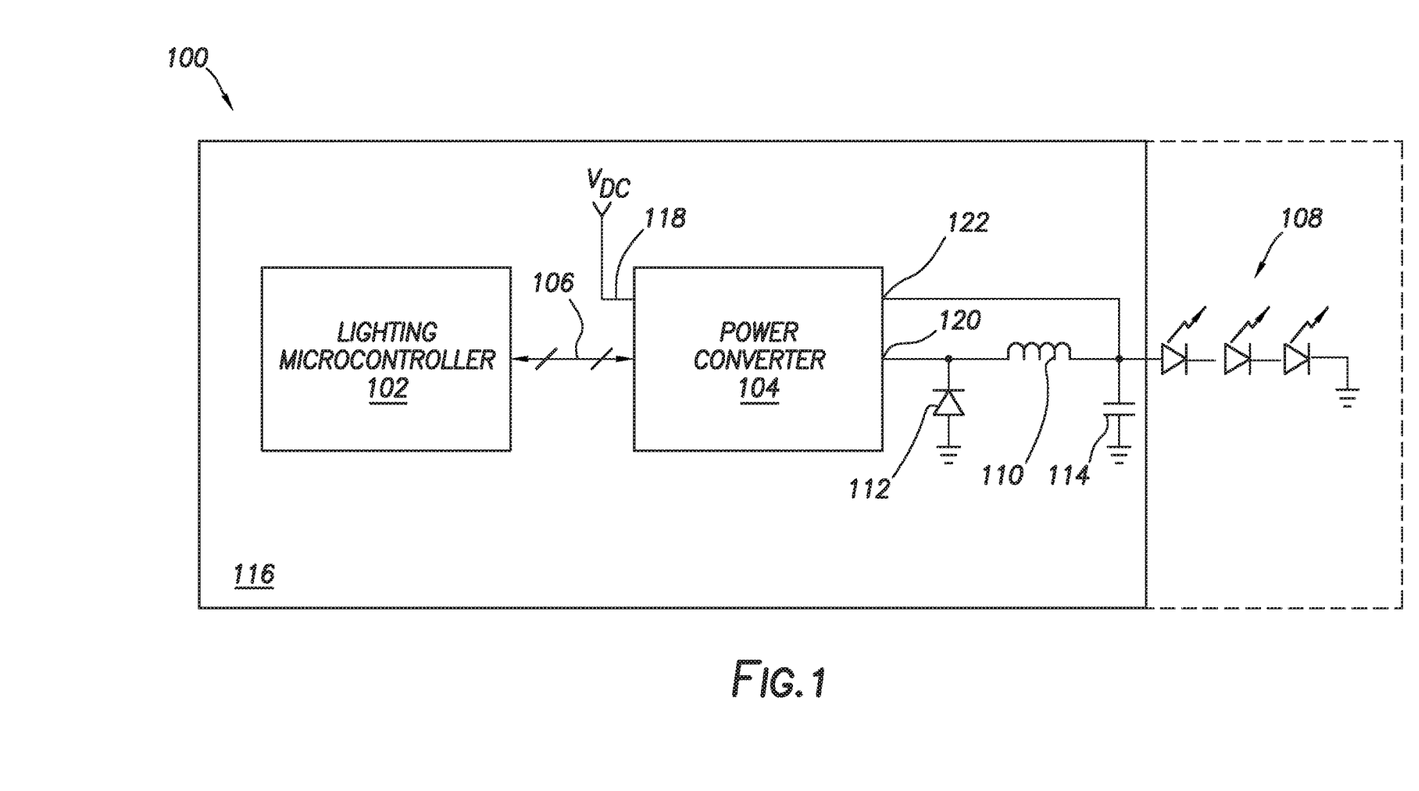
FIG. 1 shows a block diagram of a system for operating LEDs in accordance with at least some embodiments.

FIG. 1 shows a block diagram of a system for operating LEDs in accordance with at least some embodiments. In particular, FIG. 1 shows an example system 100, which could be a lighting system for an automobile, or a lighting system for a home, to name a few. The example system 100 comprises a lighting microcontroller 102. The lighting microcontroller 102 may communicate with other devices and implement an overall lighting control strategy for many LEDs within a system (e.g., automobile, home). The example lighting microcontroller 102 communicatively couples to a power converter 104 by way of a communication channel 106. The communication channel 106 may take many forms. In some cases the communication channel may be a plurality of conductors upon which analog and/or Boolean signals may be exchanged between the lighting microcontroller 102 and the power converter 104. In other cases, the communication channel may be a parallel or serial communication bus. In one specific embodiment, the communication channel 106 is a serial peripheral interface (SPI) bus, but other bus systems and protocols may be used (e.g., I²C bus, Universal Serial Bus (USB)).

The power converter 104 in the example system is a driver circuit designed and constructed to convert power at one DC voltage to another DC voltage. In the example system, the power converter 104 converts power from voltage source $V_{DC}$ to a lower voltage (based on additional circuits discussed below), and thus may be referred to as a buck-type DC to DC power converter. The functionality of the power converter 104 is implemented by various circuits (discussed more below) constructed on a semiconductor substrate. The semiconductor substrate may be packaged in any suitable form, such as a 16 pin dual in-line package (DIP). Other packaging configurations may be equivalently used.

The power converter 104 couples to the LEDs 108 by way an inductor 110. In particular, the power converter 104 couples to a first lead of the inductor 110, and the second lead of the inductor 110 couples to the LEDs 108 (illustratively shown as three LEDs coupled in series, but one or more LEDs in any electrical configuration may be used). Because the example system operates as a switching power converter, during some portions of the operation the power converter 104 provides no electrical current to the inductor 110 (e.g., as the current through the inductor 110 is discharging). During periods of time when the inductor 110 is discharging, the freewheeling diode 112, coupled between the first lead of the inductor and ground or common, provides the conduction path for the inductor 110 current. In other cases, a synchronous rectifier (e.g., operationally controlled field-effect transistor (FET)) may be used in place of the freewheeling diode 112. The circuit components may also include smoothing capacitor 114 to smooth the output voltage provided to the LEDs 108.

The example system 100 may be implemented with the various components in separate physical locations. For example, in automotive lighting systems the lighting microcontroller 102 may reside within the cab of the automobile, while the power converter 104 may reside in the engine compartment, and the LEDs 108 disposed as headlights or fog lights for the automobile. In other cases, the example system 100 may be coupled in whole or part on an underlying printed circuit board (PCB). As shown in FIG. 1, the lighting microcontroller 102, the power converter 104, and the various circuit components (e.g., freewheeling diode 112, inductor 110, and smoothing capacitor 114) may reside on a single PCB 116, with the LEDs 108 disposed elsewhere. Alternatively, the LEDs 108 may also be disposed on the PCB 116 (as shown by the dashed extension of the PCB 116 of FIG. 1).

The power converter 104 thus has a $V_{DC}$ input 118 coupled to the voltage source $V_{DC}$. The power converter 104 also has a switch node 120 coupled to the node between the freewheeling diode 112 and inductor 110. The power converter 104 may optionally include a voltage sense input 122 coupled to the second lead of the inductor (i.e., coupled to sense voltage provided to the LEDs 108). As mentioned above, in accordance with example embodiments the lighting microcontroller 102 reads various values from the power converter 104, and in some cases may command certain actions within the power converter 104 (the actions discussed more below). Based on the reading and/or commanding, the lighting microcontroller 102 may detect one or more failure modes of the power converter 104 and related devices (e.g., inductor 110). In order to describe detecting those failure modes, the specification now turns to a more detailed description of the power converter 104.

Figure 2:
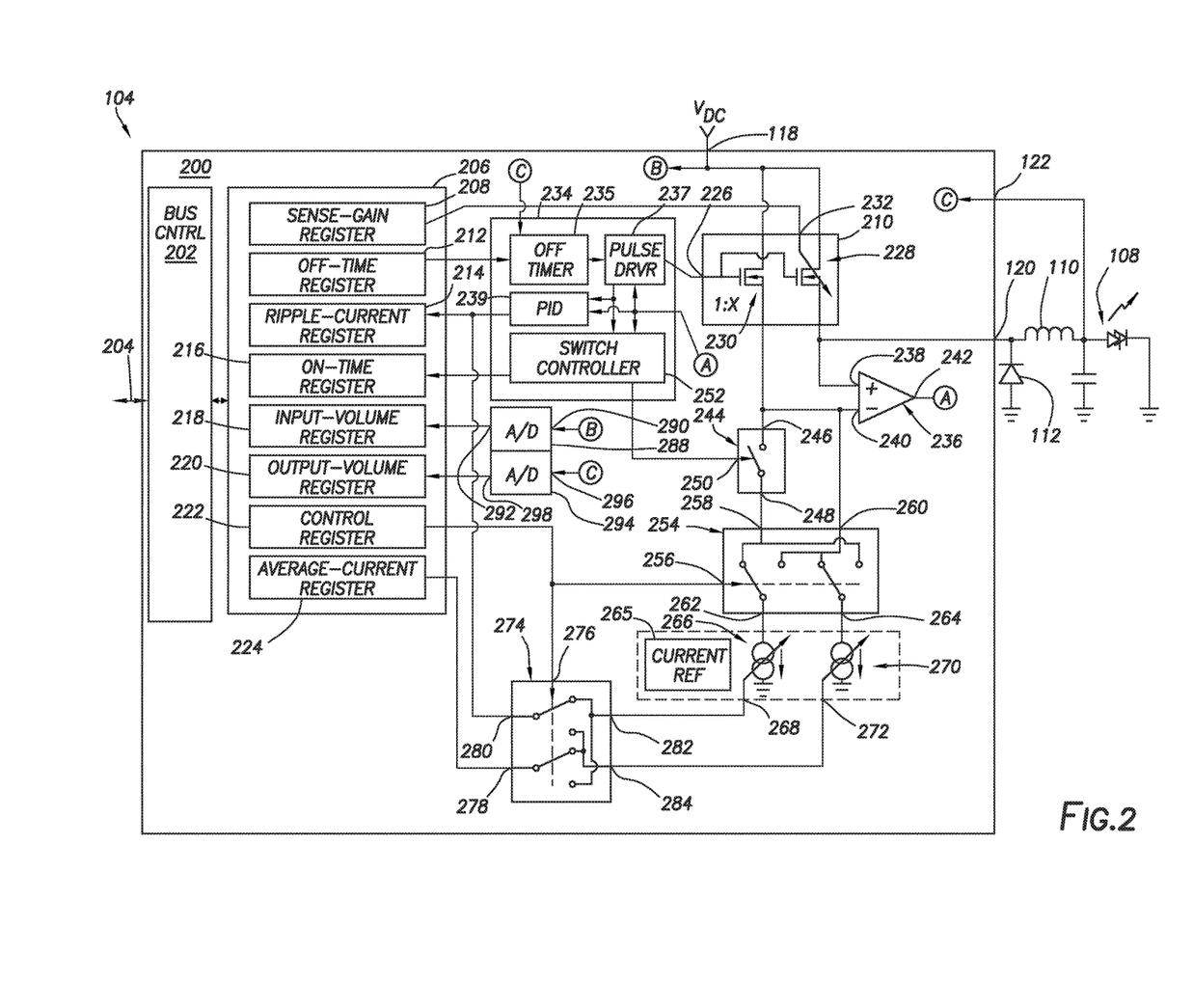
FIG. 2 shows an electrical block diagram of a power converter in accordance with at least some embodiments.

FIG. 2 shows an electrical block diagram of a power converter 104 in accordance with at least some embodiments. In particular, FIG. 2 shows the power converter 104 comprises a semiconductor substrate 200, upon which the various circuits and controllers for the power converter 104 are constructed. The example system comprises a bus controller 202 that defines a bus interface 204 over which the bus controller 202 is configured to communicate other devices, such as the lighting microcontroller 102 (FIG. 1). The example system further comprises a plurality of a registers 206 accessible by the bus controller 202. That is, the bus controller 202, and thus the lighting microcontroller 102, may read and/or write the plurality of registers 206 as part of both controlling the power converter 104, and implementing the ability to detect one or more failure modes of the power converter 104.

For the example system of FIG. 2, eight registers are implemented in the plurality of registers. One example register is a sense-gain register 208. In example system the power switch 210 implements a sensing or reference transistor (discussed more below) whose Ron resistance is a known quantity higher than the main transistor (also discussed more below) such that a reference current through the reference transistor creates a voltage substantially the same as the main transistor. The sense-gain register 208 may hold a value indicative of the relationship or ratio of current of the reference transistor relative to the main transistor. The registers may further comprise an off-time register 212 accessible by the bus controller 202. The off-time register 212 is configured to hold a value indicative of off time of the pulse signal applied to the power switch 210. A ripple-current register 214 may be implemented and accessible by the bus controller 202. The ripple-current register 214 is configured to hold a value indicative of ripple current, which may be initially written by the lighting microcontroller 102 by way of the bus interface 204; however, the value indicative of ripple current in the ripple-current register 214 becomes a control variable of a control loop for the power converter 104. An on-time register 216 may be implemented and is accessible by the bus controller 202. The on-time register 216 is configured to hold a value indicative of on time of the pulse signal applied to the power switch 210 on the most recent asserted cycle of the pulse signal applied to the power switch 210. An input-voltage register 218 may be implemented and accessible by the bus controller 202. The input-voltage register 218 is configured to hold a value indicative of input voltage $V_{DC}$ supplied to the power converter 104. An output-voltage register 220 may be implemented and accessible by the bus controller 202. The output-voltage register 220 is configured to hold a value indicative output voltage of the power converter 104. A control register 222 may be implemented and accessible by the bus controller 202. The multi-bit word in the control register 222 controls the state of various double pole, double throw switches (discussed more below) within the power converter 104. And finally, an average-current register 224 may be implemented and accessible by the bus controller 202. The average-current register 224 is configured to hold a value indicative of average current provided by the power converter 104. In example systems, the value indicative of average current is the set point of the control loop for the power converter 104.

The power converter 104 comprises the power switch 210. The power switch 210 defines a gate input 226. In particular, the power switch 210 comprises a main transistor 228 having its drain coupled to the $V_{DC}$ by way of the $V_{DC}$ input 118, and having its source coupled to the LEDs 108 by way of the switch node 120 and inductor 110. The power switch 210 further comprises a reference transistor 230 likewise having its drain coupled to $V_{DC}$. In example systems, when the gate input 226 is asserted, both the main transistor 228 and the reference transistor 230 enable current flow from drain to source. As will be described more below, a known reference current is drawn through the reference transistor 230 that creates a voltage proportional to or substantially the same as the main transistor 230. In some systems, the ratio of current flow as between the main transistor 228 and the reference transistor 2228 may be settable or adjustable, and in such systems the ratio of the current (1:X) is controlled by the value written to the sense-gain register 208, with the sense-gain register 208 coupled to a control input 232 of the power switch 210.

Still referring to FIG. 2, the example power converter 104 further comprises a regulating controller 234. The regulating controller 234 produces control signals used within the power converter 104, and in some cases the regulating controller 234 implements the control loop (e.g., a proportional-integral-differential (PID) controller 239) to control average current produced by the power converter. Thus, the regulating controller 234 is coupled to the gate input 226 of the power switch 210. The regulating controller 234 is configured to receive from the lighting microcontroller 102 an indication of off time. In the example system, the indication of off time is received from the off-time register 212 which is coupled to the regulating controller 234. The regulating controller 234 is configured to generate a pulse signal on the gate input 226 of the power switch 210, with de-asserted time of the pulse signal based on the indication of off time, and with asserted time of the pulse signal based on the value indicative of average current held in the average-current register 224 and the most recent value indicative of ripple current held in the ripple-current register 214. As shown in FIG. 2, the average-current register 224 is not directly coupled to the regulating controller 234. The control relationship between the value indicative of off time, the value indicative of average current, and the pulse signal is discussed in greater detail below after introduction of other power converter 104 circuit components.

The example power converter 104 further comprises a comparator 236 that has a first comparator input 238, a second comparator input 240, and a comparator output 242. The first comparator input 238 is coupled to the source of the main transistor 228, and the second comparator input 240 is coupled to the source of the reference transistor 230. The comparator output 242 is coupled to the regulating controller 234. The example system further comprises a current switch 244 having a control input 250, a first switch lead 246, and a second switch lead 248. The first switch lead 246 is coupled to the source of the reference transistor 230 (and the second comparator input 240). The control input 250 of the current switch 244 is coupled to the regulating controller 234, and in particular a switch controller 252 within the regulating controller 234.

The example power converter 104 further comprises a double pole, double throw switch termed a current swapping block 254. The current swapping block 254 defines a control input 256, a first block lead 258, a second block lead 260, a third block lead 262, and a fourth block lead 264. The first block lead 258 is coupled to the second switch lead of the current switch 244. The second block lead 260 is coupled to the second comparator input 240. The control input 256 is accessible from a control device external to the semiconductor device. In the example system shown, the control input 256 is coupled to control register 222, and thus the current swapping block 254 changes switch positions based on the control word held in the control register 222 (for example, the control word written by the lighting microcontroller 102).

The example system further comprises a current source 266 coupled to the third block lead 262. The current source 266 has a control input 268 that sets the controlled current flow through the current source 266. The system further comprises a second current source 270 coupled to the fourth block lead 264. The current source 270 has a control input 272 that sets the controlled current flow through the current source 270. Having now introduced the current sources 266 and 270, the specification can address configurations of the current swapping block 254. In particular, the current swapping block 254 has a first configuration (expressly shown) in which the current source 266 is coupled to the current switch 244 and the current source 270 is coupled to the second comparator input 240. The current swapping block 254 has a second configuration (that occurs when the "throw" occurs responsive to a change in the control word in the control register 222) in which the current source 266 is coupled to the second comparator input 240 and the current source 270 is coupled to the current switch 244. As will be discussed more below, the two controllable configurations are helpful in isolating failure modes within the power converter 104, particularly failure of one of the current sources.

The example system further comprises another double pole, double throw switch termed a control swapping block 274. The control swapping block 274 defines a control input 276, a first block connection 278, a second block connection 280, a third block connection 282, and a fourth block connection 284. The term "connection" in reference to the control swapping block 274 could be equivalently stated as a "lead," but "connection" is used to reduce possible confusion of the block connections with those of the current swapping block 254. The control input 276 of the control swapping block 274 is accessible from a control device external to the semiconductor device. In the example system shown, the control input 276 is coupled to control register 222, and thus the control swapping block 274 changes switch positions based on the control word held in the control register 222 (for example, the control word written by the lighting microcontroller 102). The first block connection 278 is coupled to a value indicative of average current, and in particular is coupled to the average-current register 224. The second block connection 280 is coupled to a value indicative of the ripple current, and in particular is coupled to the ripple-current register 214. The third block connection 282 is coupled to the control input 268 of the first current source 266. The fourth block connection 284 is coupled to the control input 276 of the second current source 270. The control swapping block 274 has a first configuration (expressly shown) in which the value indicative of ripple current is coupled to the control input 268 of the current source 266 and the value indicative of average current is coupled to the control input 272 of the current source 270. The control swapping block 274 has a second configuration (that occurs when the "throw" occurs responsive to a change in the control word in the control register 222) in which the value indicative of average current is coupled to the control input 268 of the current source 266 and the value indicative of ripple current is coupled to the control input 272 of the current source 270.

Still referring to FIG. 2, the example power converter 104 also comprises an analog-to-digital (A/D) converter 288 having an analog input 290 and a digital output 292. The analog input 290 is coupled to the $V_{DC}$ (as shown by bubble "B"). The digital output 292 is coupled to the input-voltage register 218. The A/D converter 288 thus continually updates the input-voltage register 218 with the input voltage provided to the power converter 104. The example power converter 104 also comprises A/D converter 294 having an analog input 296 and a digital output 298. The analog input 296 is coupled to the output voltage of the converter, and more particularly the node between the inductor 110 and the LEDs 108 (as shown by bubble "C"). The digital output 298 is coupled to the output-voltage register 220. The A/D converter 294 thus continually updates the output-voltage register 220 with the output voltage provided by the power converter 104.

The example power converter 104 is operated as an average current controller, such as described in commonly owned U.S. Pat. No. 9,887,614 titled "Apparatus, Systems And Methods For Average Current Control In A Buck DC/DC LED Driver," incorporated by reference herein as if reproduced in full below. The current specification describes setup and operation as an average current controller to inform an understanding of the failure modes that the system 100 (FIG. 1) can detect. In particular, initially the lighting microcontroller 102 (FIG. 1) provides certain information to the plurality of registers 206 used by the system. For example, the lighting microcontroller 102 may write into the sense-gain register 208 a value indicative of the ratio of the currents of the main transistor 228 and reference transistor 230 such that the power switch 210 implements the desired ratio. Next, for a particular system setup (e.g., selected inductance of the inductor and expected output voltage), the off time of the pulse signal provided to the main switch is constant, and thus the lighting microcontroller 102 may write into the off-time register 212 a value indicative of off time. The value indicative of off time is coupled to an off timer 235 that provides a timer signal to the pulse driver 237. In some embodiments the off time generated by the off timer 235 can be inversely proportional to $V_{LED}$ (e.g., voltage on output of the converter, marked as "C") in order to keep the ripple constant when output voltage changes. In operation the pulse driver 237 drives the pulse signal to the gate input 226, and the de-asserted time of the pulse signal is constant and set by the off timer 235 (and thus the value indicative of off time in the off-time register 212). The lighting microcontroller 102 may further write an initial value into the ripple-current register 214. As noted above, however, the value held in the ripple-current register 214 is the control variable within a control loop controlling average current, and thus the value within the ripple-current register 214 varies during operation. In one example system, once the power converter 104 is operational the PID controller 239 (illustratively shown within the regulating controller 234) continuously updates the value in the ripple-current register 214 as part of the closed-loop control of average current.

The lighting microcontroller 102 may further write into the average-current register 224 a value indicative of average current, which is effectively the set point for the control implemented by the power converter 104. Finally, the lighting microcontroller 102 writes to the control register 222 a value that sets the respective configurations of the current swapping block 254 and the control swapping block 274. It is noted that the current swapping block 254 and the control swapping block 274 are implemented to assist in detecting failure modes of the power converter 104, and do not play a role in the cycle-to-cycle operation implemented by the power converter 104. Thus, as expressly shown in FIG. 2, the current source 266 thus produces a current related to the ripple current, and current source 270 thus produces a current related to average current, and these two current sources play a role in setting the on time of the pulse signal provided to the gate input 226 of the power switch 210 (by operation of the comparator 236, and discussed more below).

Figure 3:
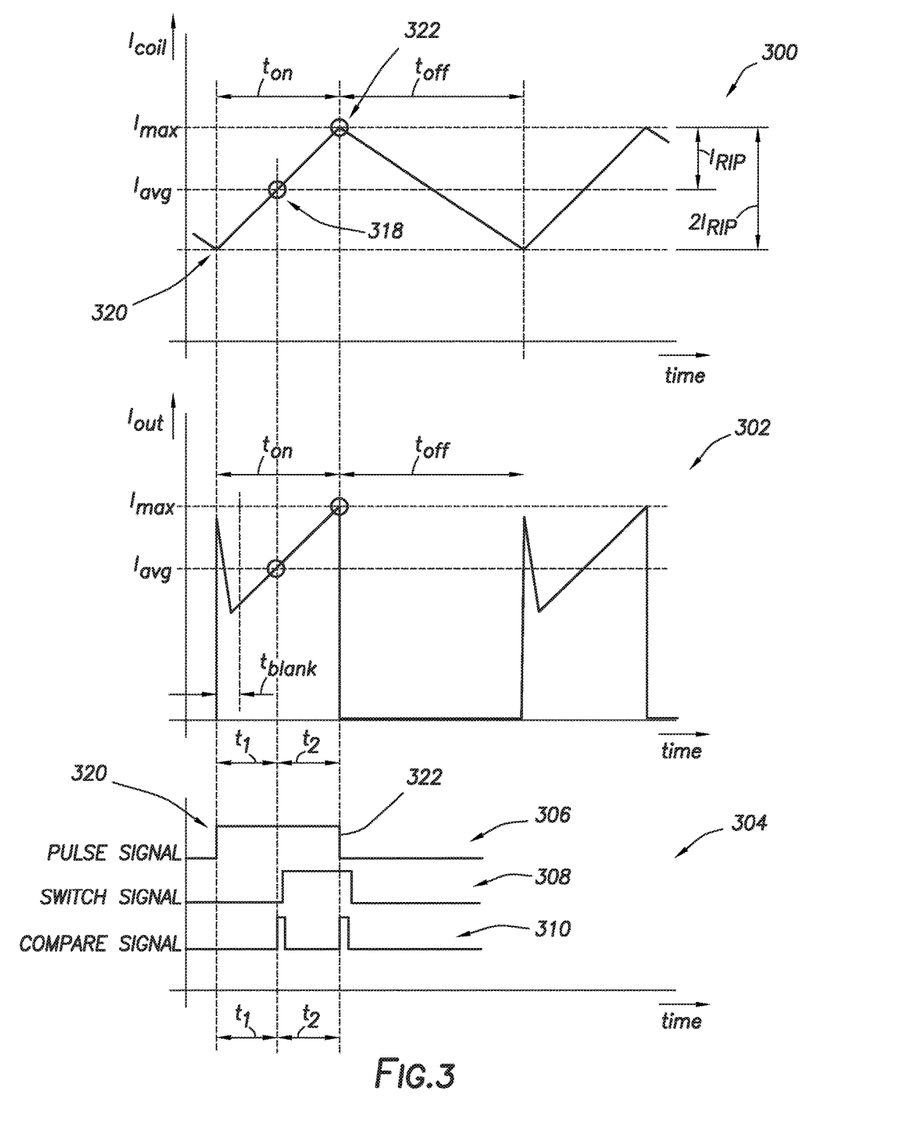
FIG. 3 shows a timing diagram in accordance with at least some embodiments.

FIG. 3 shows a timing diagram in accordance with at least some embodiments. In particular, plot 300 shows the inductor current as a function of time, and in particular through about 1.5 switching periods. It is noted that inductor current is not actually measured in the example power converter 104, but the plot is provided for purposes of explanation. Plot 302 shows current through the main transistor 228 as a function of time. Plot 304 shows a plurality of example Boolean signals within the system, and in particular shows the pulse signal 306 provided to the gate input 226 of the power switch 210, the switch signal 308 provided to the control input 250 of the current switch 244, and a compare signal 310 created by the comparator 236.

Referring simultaneously to FIGS. 2 and 3 (and specifically plots 300 and 304), at the expiration off timer 235 (time 320) the pulse signal 306 is asserted by the pulse driver 237. The power switch 210 is thus activated, and the current through inductor begins to rise as shown in plot 300. After a finite amount of time referred to as $t_{ON}$, the current through the inductor reaches a peak value referred to in plot 300 as $I_{MAX}$. When the inductor current reaches $I_{MAX}$ at time 322, the pulse signal 306 is de-asserted (i.e., the power switch 210 becomes non-conductive), and the off timer 235 is triggered forcing the next fixed off time, referred to as $t_{OFF}$ in FIG. 3. For a constant input voltage and constant output voltage, when providing a steady-state current to the LEDs, the on time $t_{ON}$ and off time $t_{OFF}$ should be constant. However, varying physical conditions (e.g., exterior temperature, temperature of the LEDs 108, number of LEDs 108 in operation, input voltage) may require a change in operation of the power converter 104 in order to hold the set point average current. For example, ambient temperature swings may change the effective inductance of the inductor 110. Ambient temperature swings may change the impedance of the wiring to the LEDs. Input voltage may vary. In order to provide the set point average current, the power converter controls the $t_{ON}$ time by adjusting the $I_{MAX}$ level.

The on time $t_{ON}$ can be conceptually divided into a first period t1 and a second period t2 as shown in FIG. 3. The first period t1 begins when the pulse signal 306 is asserted and the power switch 210 becomes conductive, and the first period ends when the current through the inductor meets a mid-point current 318. The second period t2 begins when the current through the inductor meets the mid-point current 318 and ends when the current reaches peak current $I_{MAX}$ at time 322. When time length of the first period t1 matches the time length of the second period t2, it works out mathematically that the midpoint current 318 is the average current $I_{AVG}$ provided to the LEDs 108. The power converter 104 thus monitors the length of the first period t1 and length of the second period t2, and regulates the system to have t1 match t2 in steady-state operation.

As mentioned above, ripple current is the controlled variable modulated to control a set point average current.

The relationship between ripple current, the $I_{AVG}$ current and the $I_{MAX}$ current is shown in plot 300. In particular, in steady-state operation the peak-to-peak current value is twice the ripple current (i.e., $2*I_{RIP}$) as illustrated. It follows that the relationship between ripple current and $I_{MAX}$ is that the $I_{MAX}$ is $I_{AVG}$ plus $I_{RIP}$. Conceptually then, during transient cycles when t1 does not equal t2 in an on time $t_{ON}$ period, the system 100 adjusts the value indicative of ripple current in the ripple-current register 214 in an attempt to force t1 to equal t2 in the next cycle. For example, if t1 is greater than t2 in a first cycle of the pulse signal, the value indicative of ripple current is increased (i.e., $I_{MAX}$ is increased) in an attempt to lengthen t2 in the next cycle of the pulse signal. Oppositely, if t1 is less than t2 in a first cycle of the pulse signal, the value indicative of ripple current is decreased (i.e., $I_{MAX}$ is decreased) in an attempt to shorten t2 in the next cycle.

Before turning to the example implementation of measuring t1 and t2 by the power converter 104, attention turns briefly to plot 302. Again, plot 302 shows current through the main transistor 228. When the pulse signal 306 is asserted, both the reference transistor 230 and the main transistor 228 become conductive. Because of parasitic capacitances within the system 100, initially there may be a high inrush current through the main transistor 228 that in some cases may exceed even the expected average current $I_{AVG}$. The inrush current is not truly indicative of inductor current (as shown by plot 300), and thus in order to avoid false indications by the comparator 236, the example system implements a blanking time $t_{BLANK}$.

In accordance with example embodiments, the on time $t_{ON}$ is measured by the power converter by a combination of the comparator 236, the current switch 244, and the current sources 266 and 270. In particular, during period t1, the current switch 244 is off or non-conductive. Thus, of the two current sources 266 and 270, only the second current source 270 is coupled to the second comparator input 240, and as shown in FIG. 2 the current source 270 drives a current proportional to the value indicative of average current held in the average-current register 224 (i.e., the set point average current). Comparator 236 thus compares the voltage on the source of the main transistor 228 (which voltage is proportional to current through the main transistor 228) to a voltage on the source of the reference transistor 230 (the voltage fixed by current source 270). When the voltages cross (indicating $I_{AVG}$ has been met), the comparator 236 asserts comparator output 242 as shown by compare signal 310. Once the compare signal 310 is asserted, the regulating controller 234 asserts the control input 250 of the current switch 244, thus closing or making conductive the current switch 244.

Closing of the current switch 244 switches the first current source 266 into the circuit coupled to the second comparator input 240. The compare signal 310 on the comparator output 242 is thus de-asserted again, and the comparator 236 continues to compare the voltage on the source of the main transistor 228 to a voltage on the source of the reference transistor 230 (the voltage fixed by current sources 266 and 270). When the voltages cross (indicating $I_{MAX}$ has been met), the comparator 236 again asserts comparator output 242 as shown by compare signal 310. The second assertion of the compare signal 310 signals the end of the $t_{ON}$ period and the beginning of the $t_{OFF}$ period. For purposes of control, however, the time t1 is measured by the regulating controller 234 as the time between assertion of the pulse signal 306 (or, equivalently, expiration of the off timer) and the first assertion of the compare signal 310. The time t2 is measured by the time between the first and second assertions of the compare signal 310.

In some example systems, the PID controller 239 receives indications of the time periods t1 and t2 and makes adjustments to the value indicative of the ripple current in the ripple-current register 214 as needed to balance t1 and t2 and thus provide the set point average current. In other cases, however, devices external to the power converter 104, such as the lighting microcontroller 102, may read various values from the plurality of registers 206 and implement the control loop aspects. For example, the lighting microcontroller 102 may: write a value indicative of average current to the power converter; write a value indicative of ripple current to the power converter; and recursively read a values indicative of t1 and t2 (in registers for t1 and t2 not specifically shown). More particularly, in one example system where the control loop resides external to the power converter 104, the switch controller 252 may write a value indicative of t1 and a value indicative of t2 to one or more registers. The lighting microcontroller 102 may thus read the values indicative of t1 and t2 from the on-time register 216 across the bus interface 204, and then write an updated value indicative of ripple current to the ripple-current register 214 to control the $I_{MAX}$ current in the next switching cycle. In another embodiment where the control loop resides external to the power converter 104, the switch controller 252 may write a status indicative of t1 and t2 comparison into the on-time register 216 (e.g., one bit value additional to the on time measured).

The specification now turns to detecting failure modes of the power converter 104, and in some cases the broader system 100. The example system performs three high-level checks to detect the failure modes. The outcome of each check identifies that a failure has occurred in one of a group of components or systems, but the systems and methods may not be able to isolate the failure to a specific component. With those thoughts in mind, the specification turns to the first high-level check related to the on time $t_{ON}$.

Returning to FIG. 2, the first example high-level check is designed to detect failure of either the off timer 235 or failure of the current switch 244. In particular, in the example system the lighting microcontroller 102 reads a plurality of values from the power converter 104, and from those values determines whether the $t_{ON}$ time matches an expected $t_{ON}$ time given the various parameters of the system 100. That is, for a particular system the on time $t_{ON}$ is related to the input voltage, the output voltage, and a constant according to the following equation:

$$t_{ON} = \frac{K_{Toff}}{V_{IN} - V_{OUT}} \qquad (1)$$

where $K_{Toff}$ is a constant for given setting of Off-time register 212 assuming $T_{OFF}$ is generated as inversely proportional to Vled (node C), $V_{IN}$ is the input voltage (i.e., $V_{DC}$), and $V_{OUT}$ is the output voltage. Thus, in the example system the lighting microcontroller 102 reads a value indicative of on time of the power switch within the power converter, and particularly reads on-time register 216 across the bus interface 204. The lighting microcontroller 102 reads a value indicative of input voltage to the power converter, and in particular reads the input-voltage register 218 across the bus interface 204. The lighting microcontroller 102 reads a value indicative of output voltage of the power converter, and in particular reads output-voltage register 220 across the bus interface 204. With the information gathered, the lighting microcontroller 102 calculates an expected on time based on the value indicative of input voltage and the value indicative of output voltage. The lighting microcontroller 102 may then send an indication of a failure to an external device (e.g., automobile main systems controller) if the value indicative of on time differs from the expected on time by more than a predetermined amount.

The value indicative of on time differing from the expected on time by more than a predetermined amount may indicate that the off timer 235 has failed and is providing an incorrect off time. That is, failure of the off timer 235 manifests itself as incorrect on time $t_{ON}$ as the system attempts to regulate to the set point average current. Likewise, the value indicative of on time differing from the expected on time by more than a predetermined amount may indicate that the current switch 244 has failed. That is, failure of the current switch 244 manifests itself as incorrect on time $t_{ON}$, and in fact in some cases the control loop attempting to regulate to the set point average current will not be able to do so (referred to as a regulation failure).

The second example high-level check is designed to detect failure of a host of devices/systems, such as: failure of the sense ratio of the power switch 210; unexpected change of inductance of the inductor 110; failure of the current source whose control input is coupled to the ripple-current register 214; failure of the current reference 265 that the current sources 266 and 270 use as a reference for producing their respective currents; failure of the off timer 235; and failure of the current swapping block 254 and/or the control swapping block 274. In particular, in the example system the lighting microcontroller 102 reads the value indicative of ripple current from the power converter 104, and from that values determine whether ripple current within the system matches an expected ripple current. That is, for a particular system the ripple current is related to a constant and the inductance according to the following equation:

$$I_{RIP} = \frac{K_{Toff}}{2L} \quad (2)$$

where $I_{RIP}$ is the ripple current, and L is the inductance of the inductor. Thus, in the example system the lighting microcontroller 102 reads a value indicative of ripple current from the power converter, and in particular reads the ripple-current register 214. With the value indicative of ripple current from the register, the lighting microcontroller calculates an expected ripple current based on inductance of the inductor (nominal inductance of the inductor, which is assembled in the system, is stored in the microcontroller memory). The lighting microcontroller 102 may then send an indication of a failure to the external device (e.g., automobile main systems controller) if the value indicative of ripple current differs from the expected ripple current by more than a predetermined threshold.

The value indicative of ripple current differing from the expected ripple current by more than a predetermined amount may indicate failure of any of the previously listed components. That is, failure of the sense ratio of the power switch 210 may result in the power converter 104 reaching what it believes is steady-state operation providing the set point average current. However, because of the example failure of the sense ratio the actual average current to the LEDs 108 is either higher or lower. While the magnitude of the ripple current may be correct, the peak current will be higher or lower, respectively, and thus the value indicative of ripple current will be correspondingly higher or lower (because the $I_{MAX}$, determined based on the value indicative of ripple current, will be correspondingly higher or lower). Likewise, an unexpected drop in the inductance of the inductor 110 (e.g., as caused by cracking of the inductor casing) may result in the power converter 104 reaching a steady-state operation providing the set point average current; however, because of the drop in inductance a higher $I_{MAX}$ current will be needed to achieve the $I_{AVG}$. It follows the controlled variable in the form of the value indicative of ripple current in the ripple-current register 214 will be correspondingly higher.

Similarly, failure or partial failure of the current source whose control input is coupled to the ripple-current register 214 changes the point at which the power converter 104 transitions to the off time. In some cases with this failure (e.g., full failure), the power converter 104 may experience a regulation error. In other cases (e.g., partial failure), the power converter 104 may reach steady-state operation providing the set point average current, but because of the failure the value indicative of ripple current in the ripple current register may be significantly different than expected. A related failure, failure of the current reference 265 that the current sources 266 and 270 use as a reference for producing their respective currents, manifests itself similarly.

Failure of the off timer 235, depending on the failure mode, too may manifest itself as an unexpected ripple current (in addition to the manifestation as an unexpected or incorrect on time $t_{ON}$). Finally, failure of the current swapping block 254 may manifest itself as an unexpected ripple current. For example, one of the current sources 266 or 270 becoming electrically disconnected, or being coupled to the same point, would result in an unexpected ripple current (if the power converter 104 could control output current at all).

The third example high-level check is designed to detect failures of the current sources 266 and 270. The third example check is related to the first example high-level check from an identification standpoint, and also relies on operation of the current swapping block 254 and control swapping block 274. In particular, consider the power converter 104 of FIG. 2 with the current swapping block 254 and the control swapping block 274 providing electrical connections as shown in the figure, and the power converter 104 in steady-state operation. Assuming a constant $V_{DC}$ and constant impedance presented by the inductor 110 and LEDs 108, the value indicative of ripple current in the ripple-current register 214 will be relatively constant, and the value indicative of on time in the on-time register 216 will likewise be relatively constant. As noted above, however, it is possible to reach steady-state operation even in the presence of some failure modes associated with the current sources 266 and 270. The third example high-level check involves swapping the duties of the current sources 266 and 270 and then monitoring operation of the power converter 104 for unexpected changes.

The third example high-level check may first involve reading, by the lighting microcontroller 102, a first value indicative of on time of a power switch within the power converter, and more particularly reading the on-time register 216 across the bus interface. Thereafter the lighting microcontroller 102 commands swapping of duties of two current sources within the power converter. In the example power converter 104 shown in FIG. 2, swapping of the duties of the two current sources 266 and 270 may involve writing, by the lighting microcontroller 102, a value to the control register 222 across the bus interface 204. The value written, coupled to the control inputs 256 and 276 of the current swapping block 254 and control swapping block 274, triggers a change or position or "throw" of the switches in the blocks. The result (not specifically shown in FIG. 2) is that the current source 266 is directly coupled to the second comparator input 240, and the current source 270 is directly coupled to the second lead of the current switch 244. Similarly, based on operation of the control swapping block 274, the ripple-current register 214 is coupled to the control input 272 of the current source 270, and the average-current register 224 is coupled to the control input 268 of the current source 266.

If the current sources 266 and 270 are operating properly, the swapping of duties should result in no appreciable change in the on time $t_{ON}$ or the controlled variable in the ripple-current register 214. On the other hand, if one or both current sources 266 and 270 have failed in some form, swapping of the duties will result in changes to at least one of $t_{ON}$ and the controlled variable in the ripple-current register 214 as the control loop again attempts to modify the value in the ripple-current register 214 to achieve steady-state operation. Thus, the lighting microcontroller 102, after commanding the swap, reads a second value indicative of on time of the power switch, and more particular reads again the value indicative of on time in the on-time register. The lighting microcontroller 102 then sends an indication of a failure to an external device if the first value of indicative of on time (i.e., the value before the swapping of duties) differs from the second value indicative of on time (i.e., the value after the swapping of duties), by more than a predetermined threshold.

Figure 4:
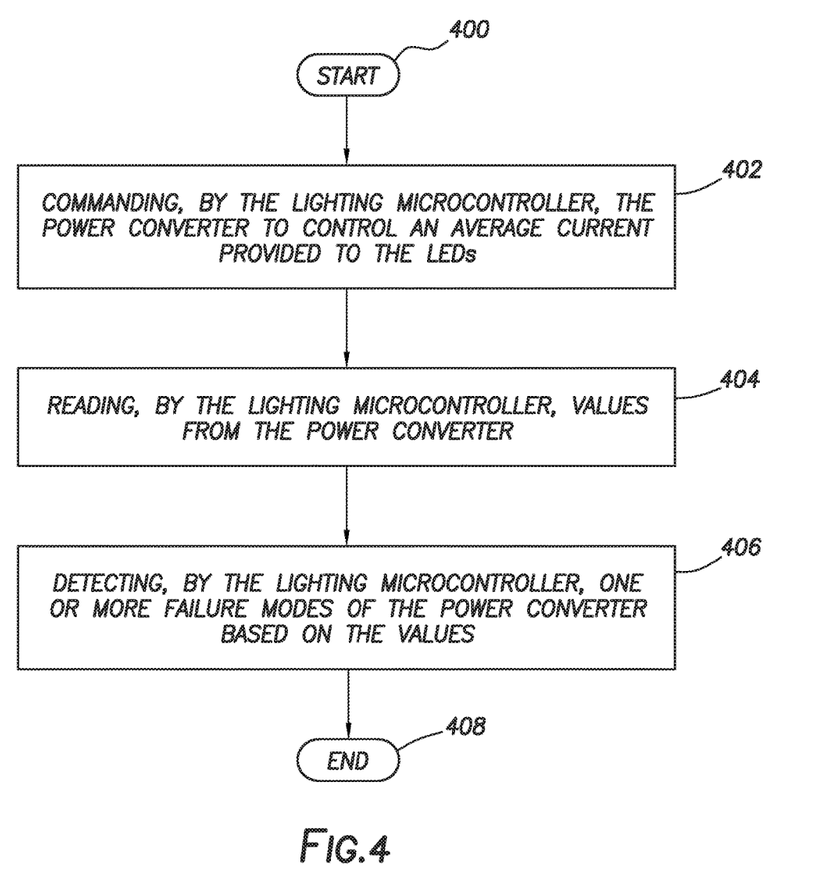
FIG. 4 shows a method in accordance with at least some embodiments.

FIG. 4 shows a method in accordance with at least some embodiments. That is, in a system comprising a lighting microcontroller communicatively coupled to a direct current DC to DC power converter coupled to LEDs by way of an inductor, an example method may start (block 400), and may comprise: commanding, by the lighting microcontroller, the power converter to control an average current provided to the LEDs (block 402); reading, by the lighting microcontroller, values from the power converter (block 404); and detecting, by the lighting controller, one or more failure modes of the power converter based on the values (block 406). Thereafter, the method may end (block 408).

Figure 5:
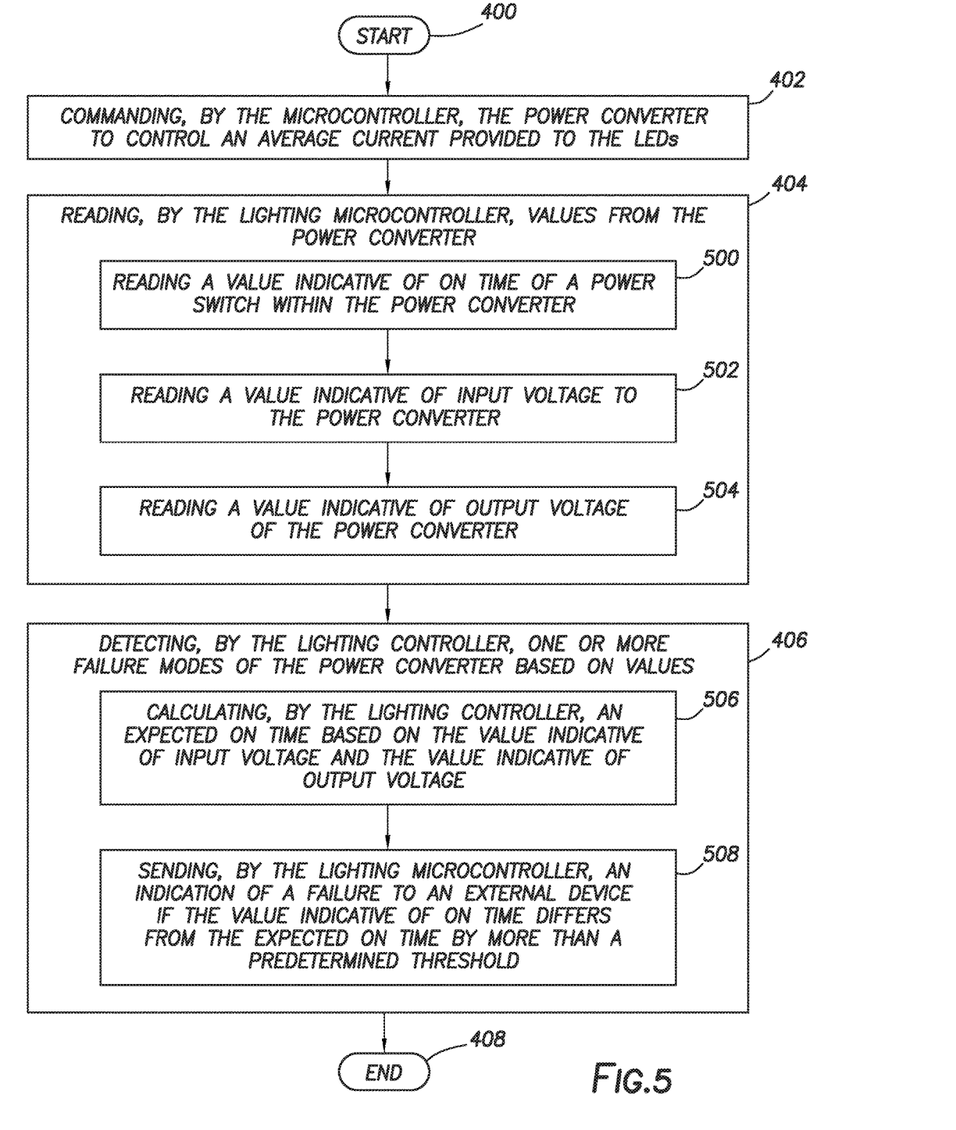
FIG. 5 shows a method in accordance with at least some embodiments.

FIG. 5 shows a method in accordance with at least some embodiments. In particular, the method of FIG. 5 is the method of FIG. 4, and where the reading method step further comprises: reading a value indicative of on time of a power switch within the power converter (block 500); reading a value indicative of input voltage to the power converter (block 502); and reading a value indicative of output voltage of the power converter (block 504). In the example method of FIG. 5 the detecting method step further comprises: calculating an expected on time based on the value indicative of input voltage and the value indicative of output voltage (block 506); and sending an indication of a failure to an external device if the value indicative of on time differs from the expected on time by more than a predetermined amount (block 508).

Figure 6:
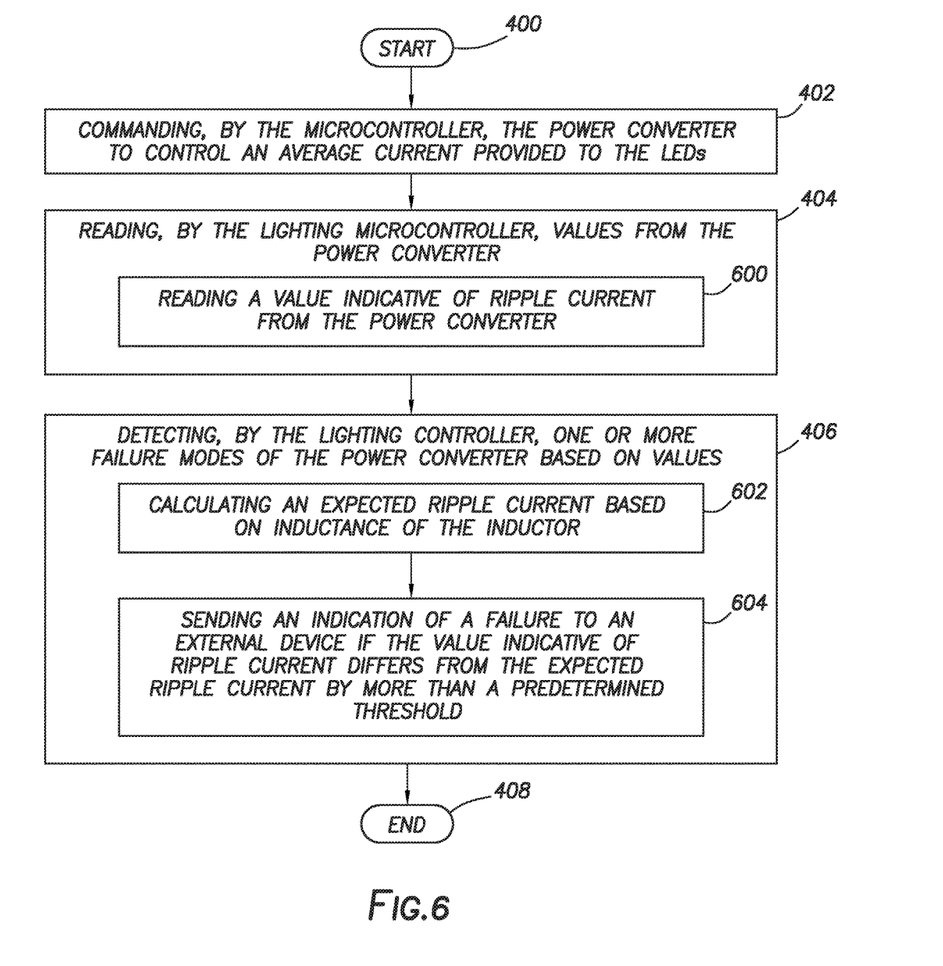
FIG. 6 shows a method in accordance with at least some embodiments.

FIG. 6 shows a method in accordance with at least some embodiments. In particular, the method of FIG. 6 is the method of FIG. 4, and where the reading method step further comprises reading a value indicative of ripple current from the power converter (block 600). In the example method of FIG. 6 the detecting method step further comprises: calculating an expected ripple current based on inductance of the inductor (block 602); and sending an indication of a failure to an external device if the value indicative of ripple current differs from the expected ripple current by more than a predetermined threshold (block 604).

Figure 7:
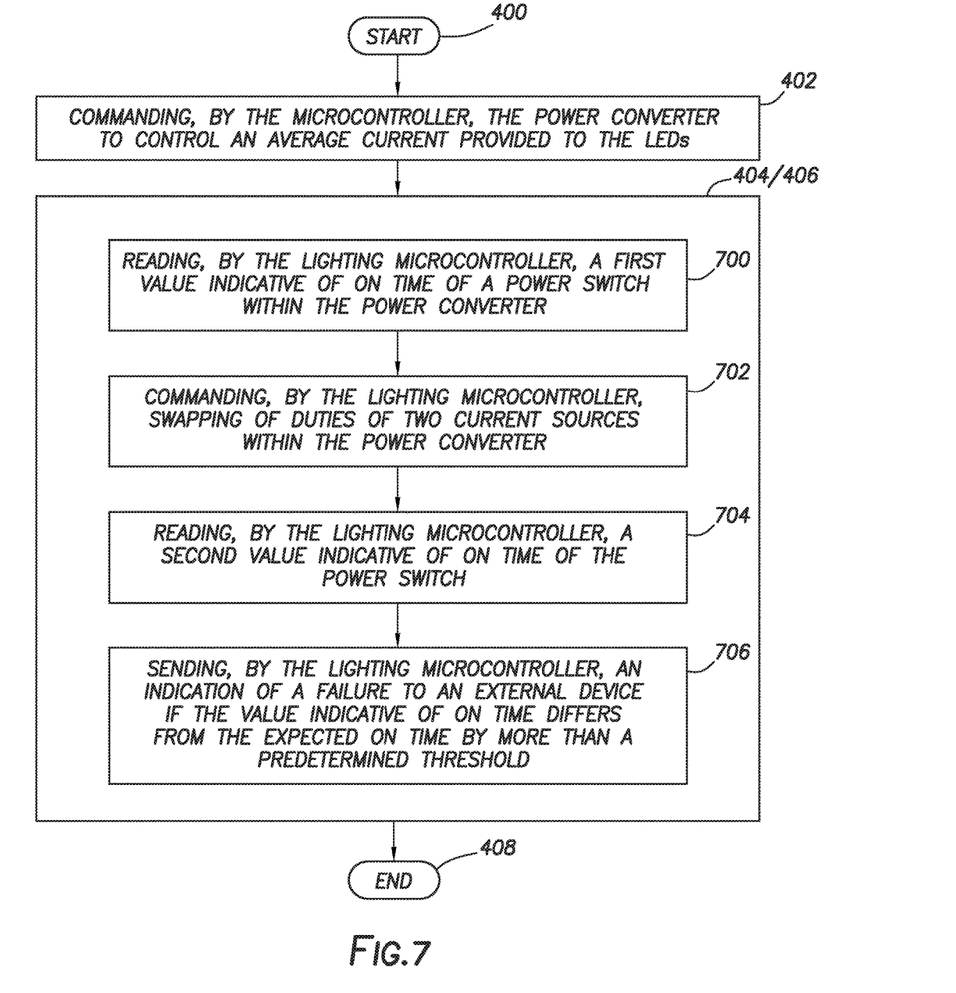
FIG. 7 shows a method in accordance with at least some embodiments.

FIG. 7 shows a method in accordance with at least some embodiments. In particular, the method starts (block 400), and may comprise: commanding, by the lighting microcontroller, the power converter to control an average current provided to the LEDs (block 402); reading, by the lighting microcontroller, a first value indicative of on time of a power switch within the power converter (block 700); commanding, by the lighting microcontroller, swapping of duties of two current sources within the power converter (block 702); reading, by the lighting microcontroller, a second value indicative of on time of the power switch (block 704); and sending, by the lighting microcontroller, an indication of a failure to an external device if the first value of indicative of on time differs from the second value indicative of on time by more than a predetermined threshold (block 706). Thereafter the method may end (block 408).

The above discussion is meant to be illustrative of the principles and various embodiments of the present invention. Numerous variations and modifications will become apparent to those skilled in the art once the above disclosure is fully appreciated. For example, the various embodiments discuss a control swapping block 274 connecting the control words to the respective current sources; however, in other embodiments the functionality may be implemented by digital gates that control the switching of the control bus upstream of the registers in the plurality of registers 206. Further, while some embodiments implement two A/D converters 288 and 294, in other embodiments a single A/D converter may be implemented to time multiplex the writing of the voltage measurements into the respective registers. It is intended that the following claims be interpreted to embrace all such variations and modifications.

What is claimed is:

1. A method of operating a direct current (DC) to DC power converter, comprising:
    commanding, by a lighting microcontroller, a power converter to control an average current provided to light-emitting diodes (LEDs) coupled to the power converter by way of an inductor;
    reading, by the lighting microcontroller, values from the power converter; and
    detecting, by the lighting microcontroller, one or more failure modes of the power converter based on the values.

2. The method of claim 1 wherein reading values from the power converter further comprises reading one or more registers implemented within the power converter, the reading across a communication bus coupled between the lighting microcontroller and the power converter.

3. The method of claim 2 further comprising reading the one or more registers across a serial peripheral interface (SPI) bus.

4. The method of claim 1:
    wherein reading values further comprises:
        reading a value indicative of on time of a power switch within the power converter;
        reading a value indicative of input voltage to the power converter;
        reading a value indicative of output voltage of the power converter;
    wherein detecting one or more failure modes further comprises:

calculating, by the lighting microcontroller, an expected on time based on the value indicative of input voltage and the value indicative of output voltage;

sending, by the lighting microcontroller, an indication of a failure to an external device if the value indicative of on time differs from the expected on time by more than a predetermined amount.

5. The method of claim 1:

wherein reading values further comprises reading, by the lighting microcontroller, a value indicative of ripple current from the power converter;

wherein detecting the one or more failure modes further comprises:

calculating, by the lighting microcontroller, an expected ripple current based on inductance of the inductor; and sending, by the lighting controller, an indication of a failure to an external device if the value indicative of ripple current differs from the expected ripple current by more than a predetermined threshold.

6. The method of claim 1 wherein reading values and detecting one or more failure modes further comprises:

reading, by the lighting microcontroller, a first value indicative of on time of a power switch within the power converter; and then commanding, by the lighting microcontroller, swapping of duties of two current sources within the power converter; and then reading, by the lighting microcontroller, a second value indicative of on time of the power switch; and sending, by the lighting microcontroller, an indication of a failure to an external device if the first value indicative of on time differs from the second value indicative of on time by more than a predetermined threshold.

7. The method of claim 1:

wherein commanding further comprises writing a value indicative of average current to the power converter; and wherein the power converter implements a control loop updating a controlled variable in the form of a value indicative of peak current.

8. The method of claim 1 wherein commanding further comprises:

writing a value indicative of average current to the power converter;

writing a value indicative of ripple current to the power converter; and recursively reading a value indicative of on time from the power converter, and updating the value indicative of ripple current, to control to a balanced on time and off time.

9. A semiconductor device that implements a driver for a direct current (DC) to DC power converter for driving light-emitting diodes (LEDs), the semiconductor device comprising:

a power switch that has a gate input;

a current switch having a control input, a first switch lead, and a second switch lead, the first switch lead coupled to the power switch;

a regulating controller coupled to the gate input of the power switch and the control input of the current switch;

a first current source having a control input;

a second current source having a control input; and a current swapping block coupled to the first current source and the second current source, the current swapping block defining a control input and a plurality of block leads for switching the first current source and the second current source between the second switch lead of the current switch and the power switch, the control input of the current swapping block controllable from a control device external to the semiconductor device; wherein the regulating controller is configured to receive from the control device an indication of off time, and the regulating controller is configured to generate a pulse signal on the gate input, with de-asserted time of the pulse signal based on the indication of off time, and with asserted time of the pulse signal based on a value indication of average current;

the semiconductor device configured such that a value indicative of ripple current provided to the control input of the first current source or the second current source is a control variable of a control loop for the DC to DC power converter; and the current swapping block has a first configuration in which the first current source is coupled to the current switch and the second current source is coupled to the power switch, and the current swapping block has a second configuration in which the first current source is coupled to the power switch and the second current source is coupled to the current switch.

10. The semiconductor device of claim 9 further comprising:

a control swapping block coupled to the control input of the first current source and the control input of the second current source, the control swapping block defining a control input and a plurality of block leads for switching a value indicative of average current and a value indicative of ripple current between the control inputs of the first and second current swapping blocks, the control input of the control swapping block controllable from the control device external to the semiconductor device;

the control swapping block has a first configuration in which the value indicative of ripple current is coupled to the control input of the first current source and the value indicative of average current is coupled to the control input of the second current source, and a second configuration in which the value indicative of average current is coupled to the control input of the first current source and the value indicative of ripple current is coupled to the control input of the second current source.

11. The semiconductor device of claim 9 further comprising:

a bus controller that defines a bus interface over which the bus controller is configured to communicate with the control device;

an average current register accessible by the bus controller, the average current register configured to hold the value indicative of average current, and the average current register coupled to a first block connection of the control swapping block;

a ripple current register accessible by the bus controller and coupled to the regulating controller, the ripple current register configured to hold the value indicative of ripple current, and the ripple current register coupled to a second block connection of the control swapping block; and a swap command register accessible by the bus controller, the swap command register coupled to the control input of the current swapping block, and the swap command register coupled to the control input of the control swapping block;

wherein the semiconductor device is configured to implement the first configuration of the current swapping block and the control swapping block based on a first value in the swap command register, and configured to implement the second configuration of the current swapping block and the control swapping block based on a second value in the swap command register.

12. The semiconductor device of claim 11 further comprising the regulating controller configured to implement a control loop that updates the value indicative of ripple current in the ripple current register to control average current produced to drive the LEDs.

13. The semiconductor device of claim 9 further comprising the regulating controller configured to implement a control loop that controls average current produced to drive the LEDs.

14. A system for operating a light-emitting diode (LED), comprising:
 a lighting microcontroller;
 a power converter communicatively coupled to the lighting microcontroller;
 an LED coupled to the power converter by way of an inductor;
 the power converter comprises:
  a power switch that has a gate input, the power switch coupled to the LED by way of the inductor;
  a current switch having a control input, a first switch lead, and a second switch lead, the first switch lead coupled to the power switch;
  a regulating controller coupled to the gate input of the power switch and the control input of the current switch, the regulating controller configured to receive from the lighting microcontroller one or more commands to regulate an output current of the power converter;
  wherein the regulating controller is configured to receive from the lighting microcontroller an indication of off time, and the regulating controller is configured to generate a pulse signal on the gate input, with de-asserted time of the pulse signal based on the indication of off time, and with asserted time of the pulse signal based on a value indicative of average current provided to the control input of the first current source;
  the power converter configured such that a value indicative of ripple current provided to the control input of the second current source is a control variable of a control loop for the power converter;
 wherein the lighting microcontroller is configured to read values from the power converter and detect one or more failure modes of the power converter based on the values from the power converter.

15. The system of claim 14:
wherein the power converter further comprises:
 a bus controller that defines a bus interface coupled to the lighting microcontroller;
 a plurality of registers accessible by the bus controller;
wherein reading values from the power converter by the lighting microcontroller further comprises reading one or more registers implemented within the power converter, the reading across the bus interface.

16. The system of claim 15 wherein the bus interface is a serial peripheral interface (SPI) bus.

17. The system of claim 15:
wherein the power converter further comprises:
 a first analog-to-digital (A/D) converter having an analog input and a digital output, the analog input coupled to the inductor;
 an output-voltage register coupled to the digital input and accessible by the bus controller, the output-voltage register configured to hold a value indicative of output voltage;
 a second analog-to-digital (A/D) converter having an analog input and a digital output, the analog input of the second A/D converter coupled to a supply voltage;
 an input-voltage register coupled to the digital input of the second A/D converter and accessible by the bus controller, the input-voltage register configured to hold a value indicative of input voltage;
 an on-time register coupled to the regulating controller and accessible by the bus controller, the on-time register configured to hold a value indicative of on time of the pulse signal;
wherein when the lighting microcontroller reads values from the power converter, the lighting microcontroller is configured to read value indicative of output voltage, the value indicative of input voltage, and the value indicative of on time of the pulse signal;
wherein when the lighting microcontroller detects one or more failure modes the lighting microcontroller is configured to:
 calculate an expected on time based on the value indicative of input voltage and the value indicative of output voltage; and
 send an indication of a failure to an external device if the value indicative of on time differs from the expected on time by more than a predetermined amount.

18. The system of claim 15:
wherein the power converter further comprises a ripple current register accessible by the bus controller and coupled to the regulating controller, the ripple current register configured to hold the value indicative of ripple current;
wherein when the lighting microcontroller reads from the power converter, the lighting microcontroller is configured to read the value indicative of ripple current;
wherein when the lighting microcontroller detects one or more failure modes the lighting microcontroller is configured to:
 calculate an expected ripple current based on inductance of the inductor; and
 send an indication of a failure to an external device if the value indicative of ripple current differs from the expected ripple current by more than a predetermined threshold.

19. The system of claim 15:
wherein the power converter further comprises:
 the power switch comprising a main transistor and a reference transistor, the main transistor coupled to the LED by way of the inductor;
 a comparator that has a first comparator input, a second comparator input, and a comparator output, the first comparator input coupled to the main transistor and the second comparator input coupled to the reference transistor;
 a first current source having a control input;
 a second current source having a control input;
 a current swapping block that defines a control input, a first block lead, a second block lead, a third block lead, and a fourth block lead, the first block lead coupled to the second switch lead of the current switch, and the second block lead connected to the second comparator input;

the first current source coupled to the third block lead;

the second current source coupled to the fourth block lead;

an on-time register coupled to the regulating controller and accessible by the bus controller, the on-time register configured to hold a value indicative of on time of the pulse signal;

a control register accessible by the bus controller and coupled to the control input of the current swapping block;

the current swapping block has a first configuration in which the first current source is coupled to the current switch and the second current source is coupled to the second comparator input, and the current swapping block has a second configuration in which the first current source is coupled to the second comparator input and the second current source is coupled to the current switch;

wherein when the lighting microcontroller reads values and detects one or more failure modes, the light microcontroller is further configured to:

read a first value indicative of on time of pulse signal; and then command swapping of duties of current sources by writing the control register; and then read a second value indicative of on time of the pulse signal; and send an indication of a failure to an external device if the first value of indicative of on time differs from the second value indicative of on time by more than a predetermined threshold.

20. The system of claim 14 wherein the regulating controller further configured to implement a control loop that updates the value indicative of ripple current to control average current produced to drive the LEDs.

* * * * *